(12) United States Patent
Tomita et al.

(10) Patent No.: US 7,902,039 B2
(45) Date of Patent: Mar. 8, 2011

(54) METHOD FOR MANUFACTURING SILICON WAFER

(75) Inventors: Shinichi Tomita, Tokyo (JP); Masao Yoshimuta, Tokyo (JP); Yasuyuki Hashimoto, Tokyo (JP); Akira Nakashima, Tokyo (JP)

(73) Assignee: Sumco Corporation, Tokyo (JP)

( * ) Notice: Subject to any disclaimer, the term of this patent is extended or adjusted under 35 U.S.C. 154(b) by 114 days.

(21) Appl. No.: 11/946,643

(22) Filed: Nov. 28, 2007

(65) Prior Publication Data

US 2008/0132032 A1 Jun. 5, 2008

(30) Foreign Application Priority Data

Nov. 30, 2006 (JP) ................. 2006-323680
Nov. 30, 2006 (JP) ................. 2006-324027

(51) Int. Cl.
*H01L 21/00* (2006.01)
(52) U.S. Cl. .................. 438/455; 438/692; 438/478
(58) Field of Classification Search .............. 438/455, 438/457, 459, 974, 478, 692; 257/E21.122
See application file for complete search history.

(56) References Cited

U.S. PATENT DOCUMENTS

| | | | | |
|---|---|---|---|---|
| 5,043,044 A | * | 8/1991 | Hattori et al. | 438/33 |
| 5,561,316 A | * | 10/1996 | Fellner | 257/549 |
| 5,855,998 A | * | 1/1999 | Tanabe et al. | 428/216 |
| 6,004,860 A | * | 12/1999 | Ogawa et al. | 438/406 |
| 6,193,585 B1 | * | 2/2001 | Tanabe et al. | 451/41 |
| 7,229,926 B2 | * | 6/2007 | Matsumoto | 438/691 |
| 7,411,273 B2 | * | 8/2008 | Matsumoto | 257/618 |
| 7,446,045 B2 | * | 11/2008 | Matsumoto | 438/691 |
| 7,535,082 B2 | * | 5/2009 | Nakayama et al. | 257/620 |
| 7,781,313 B2 | * | 8/2010 | Tomita et al. | 438/478 |
| 7,786,488 B2 | * | 8/2010 | Nakayama et al. | 257/77 |
| 2003/0022495 A1 | * | 1/2003 | Netsu et al. | 438/689 |
| 2005/0093101 A1 | * | 5/2005 | Matsumoto | 257/617 |
| 2007/0167021 A1 | * | 7/2007 | Matsumoto | 438/711 |
| 2007/0284696 A1 | * | 12/2007 | Matsumoto | 257/615 |
| 2008/0132032 A1 | * | 6/2008 | Tomita et al. | 438/455 |
| 2009/0029550 A1 | * | 1/2009 | Matsumoto | 438/691 |
| 2009/0325385 A1 | * | 12/2009 | Tomita et al. | 438/692 |
| 2010/0032806 A1 | * | 2/2010 | Kihara et al. | 257/618 |

FOREIGN PATENT DOCUMENTS

| | | |
|---|---|---|
| JP | 3-250615 A | 11/1991 |
| JP | 6-112120 A | 4/1994 |
| JP | 8-323741 A | 12/1996 |

* cited by examiner

*Primary Examiner* — Laura M Menz

(74) *Attorney, Agent, or Firm* — Brinks Hofer Gilson & Lione

(57) ABSTRACT

A method for manufacturing a silicon wafer is characterized by performing one or both of grinding and polishing to a thin discoid silicon wafer to give bowl-shaped warpage that is concave at a central part to a wafer surface. One main surface of the thin discoid silicon wafer is adsorbed and held, and one or both of grinding and polishing are performed to the other main surface to fabricate a convex wafer whose thickness is increased from a wafer outer periphery toward a wafer center or fabricate a concave wafer whose thickness is reduced from the wafer outer periphery toward the wafer center. Then, the other main surface is adsorbed and held to protrude the center or the periphery of the one main surface side based on elastic deformation. One or both of grinding and polishing are carried out with respect to the one main surface to flatten the main surface, and adsorption and holding are released to give bowl-shaped warpage that is concave at the central part to the other main surface or the one main surface. By the method, an SOI wafer or an epitaxial silicon wafer having a high degree of flatness is obtained.

6 Claims, 12 Drawing Sheets

(a) Preparation of epitaxial growth processing silicon wafer (b) Formation of epitaxial layer (a)

(b)

(a)

(b)

(a)

(b)

(a)

(b)

METHOD FOR MANUFACTURING SILICON WAFER

This application claims priority under 35 U.S.C. §119 to Japanese Patent Application Nos. JP2006-323680 filed Nov. 30, 2006, and JP2006-324027 filed on Nov. 30, 2006, the entire content of which is hereby incorporated by reference.

BACKGROUND OF THE INVENTION

1. Field of the Invention

The present invention relates to a method for manufacturing an SOI (Silicon-On-Insulator) wafer having a high degree of flatness when bonded and an epitaxial silicon wafer, and a method for manufacturing a silicon wafer serving as a support substrate for these wafers.

2. Description of the Related Art

A highly integrated CMOS (Complementary Metal Oxide Semiconductor), an IC, a high-withstand voltage device, and others have been conventionally fabricated by utilizing an SOI wafer. The SOI wafer in which a single-crystal silicon layer used as a device forming region is formed on an insulating layer is effective for prevention of latch-up (an abnormal oscillation phenomenon due to a parasitic circuit) in case of a highly integrated circuit and insulative isolation from a base substrate in case of a high-withstand voltage device. As a method for manufacturing this SOI wafer, a method of bonding silicon wafers to each other through a silicon dioxide layer, i.e., an insulating layer is known, an SOI wafer fabricated by this bonding method has very excellent crystallinity of an SOI layer, and hence this method appears promising.

However, since the insulating layer formed of the silicon oxide layer has a smaller thermal expansion coefficient than single-crystal silicon, there is an inconvenience. For example, the SOI layer side warps into a convex shape and an adsorption error occurs in a device process when an oxide film is not formed on a backside surface of a support substrate.

In order to eliminate this problem, there have been proposed method for manufacturing an SOI wafer heating both wafers to a predetermined temperature to be bonded to each other, then performing a thermal oxidation processing with respect to these wafers to form an oxide film on an entire surface thereof, polishing a surface of one wafer which is preferably a wafer having an oxide film formed thereon before bonding, and reducing a thickness of this wafer, thereby obtaining a bonded wafer (see, e.g., Japanese Patent Application Laid-open No. 250615-1991 (claims)).

Further, in an epitaxial silicon wafer having an epitaxial layer grown on an epitaxial growth silicon wafer formed of silicon single crystal, it is known that warpage occurs when a resistivity value in the epitaxial growth silicon wafer is different from a resistivity value in the epitaxial layer. That is because elastic deformation due to misfit in grating constant between the epitaxial layer and the epitaxial growth silicon wafer as a substrate occurs.

In order to solve this problem, there has been proposed a method for manufacturing an epitaxial silicon wafer identifying irregularities in a warped shape of an epitaxial growth silicon wafer, estimating warpage that occurs when an epitaxial layer is formed on a surface of this wafer, and forming the epitaxial layer on the concave surface of the epitaxial growth silicon wafer (see, e.g., Japanese Patent Application Laid-open No. 112120-1994 (claims)). According to this method for manufacturing, warpage of the surface of the epitaxial growth silicon wafer is identified in advance, a direction of this warpage is set to a direction opposite to a direction of a warping change that occurs in epitaxial growth, and the warping change in epitaxial growth is thereby canceled out, thus reducing an absolute value of warpage of the epitaxial silicon wafer.

However, the SOI wafer avoids warpage by providing the oxide film on upper and lower surfaces of a support substrate silicon wafer thereof. Therefore, presence of the oxide film on the lower surface of the SOI wafer is necessarily the premise for avoiding warpage, but the oxide film present on the lower surface of the SOI wafer may be removed in a subsequent device process in some cases. This SOI wafer still has a problem to be solved. Namely, when the oxide film on the lower surface is removed in the device process, unevenness in thermal shrinkage amounts on the upper and lower surfaces of the support substrate silicon wafer occurs, and the SOI wafer newly warps in the device process.

Further, in the epitaxial silicon wafer, when an ingot formed of a silicon single crystal is sliced into a thin discoid shape by using, e.g., an inner diameter slicer or a wire saw device, warpage can be given to the wafer in advance. On the other hand there is an inconvenience that an amount of warpage is relatively large and becomes uneven in a moving direction perpendicular to a moving direction of the inner diameter slicer or a traveling direction of a wire for slicing the ingot. Moreover, there is still a problem to be solved. That is, obtaining a flat epitaxial silicon wafer is difficult even if an epitaxial layer is formed on a surface of the epitaxial growth silicon wafer having such uneven warpage.

It is an object of the present invention to provide a method for manufacturing a silicon wafer, which can obtain an SOI wafer or an epitaxial silicon wafer having a high degree of flatness.

SUMMARY OF THE INVENTION

A first aspect of the present invention pertains to a method for manufacturing a silicon wafer, wherein a thin discoid silicon wafer is subjected to one or both of grinding and polishing to give bowl-shaped warpage that is concave at a central part to a wafer surface.

When such an SOI wafer is obtained based on a method for bonding using the silicon wafer according to the first aspect, forcible warpage given to this silicon wafer by grinding/polishing can assuredly cancel out warpage that is newly produced in the SOI wafer when the SOI wafer is obtained, thereby acquiring the flat SOI wafer.

When an epitaxial layer shown in FIG. 2 is formed on a surface of a wafer according to the first aspect to obtain an epitaxial wafer, forcible warpage given to this epitaxial growth silicon wafer by grinding/polishing processing can cancel out warpage that is newly produced in this wafer when the epitaxial silicon wafer is obtained, thus assuredly acquiring the flat epitaxial silicon wafer.

A second aspect of the present invention pertains to a method for manufacturing a silicon wafer, wherein one main surface of a thin discoid silicon wafer is adsorbed and held, one or both of grinding and polishing are performed to the other main surface to fabricate a convex wafer whose thickness is increased from a wafer outer periphery toward a wafer center, then the other main surface formed into the convex shape is adsorbed and held to protrude a center of the one main surface side based on elastic deformation, one or both of grinding and polishing are performed to the one main surface to flatten the main surface, and adsorption and holding are released to give bowl-shaped warpage that is concave at a central part to the other main surface.

According to the method for manufacturing a silicon wafer of the present invention, the wafer having the concave bowl-shaped warpage at the central part thereof is obtained by performing one or both of grinding and polishing with respect to the thin discoid wafer, namely, inverse warpage is given to the silicon wafer in comparison with warpage given in the following step. Thus a finished silicon wafer becomes flat.

DETAILED DESCRIPTION OF THE PREFERRED EMBODIMENTS

An embodiment for carrying out the present invention will now be explained hereinafter with reference to the accompanying drawings.

Figure 1:
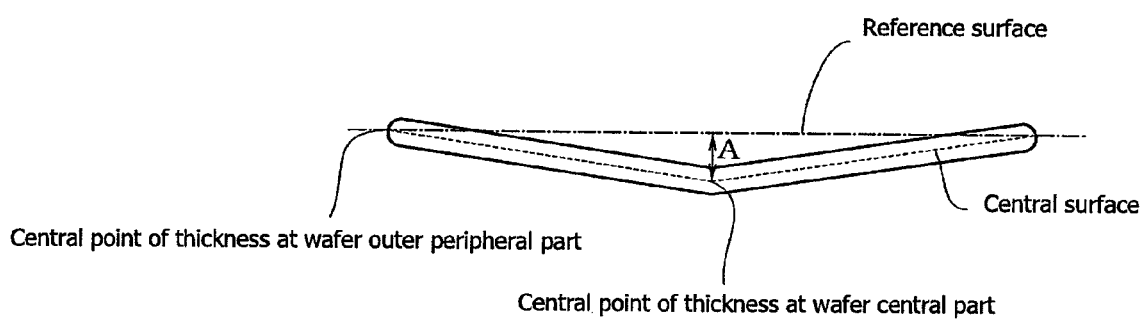
FIG. 1 is a view showing warpage of a silicon wafer according to an embodiment of the present invention.
Figure 3:
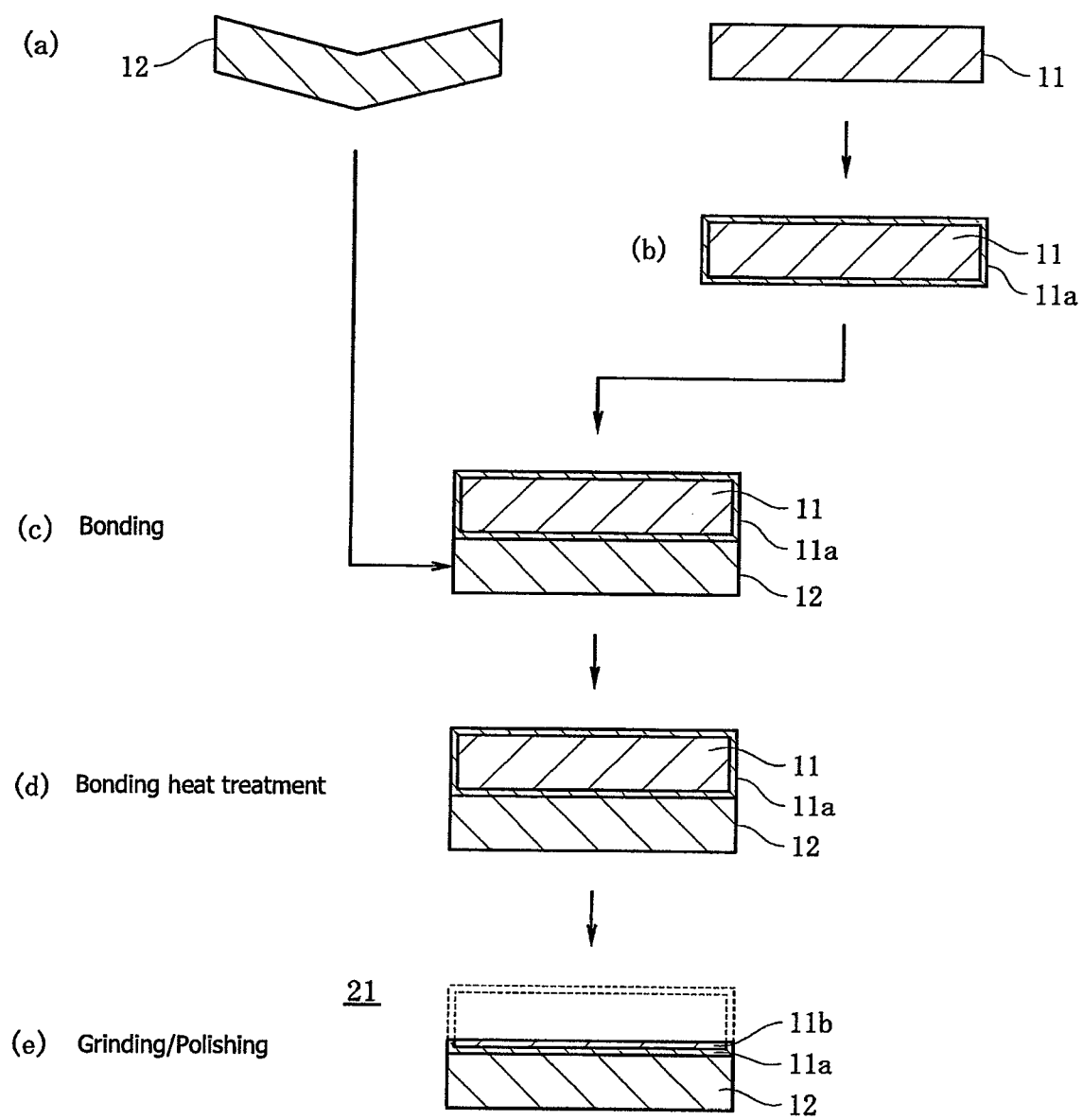
FIGS. 3(a)-(e) are partial cross-sectional views showing a manufacturing method of an SOI wafer using the silicon wafer.

As shown in FIG. 1, the present invention relates to a manufacturing method of a silicon wafer characterized in that a thin discoid wafer is subjected to one or both of grinding and polishing to give bowl-shaped warpage that is concave at a central part to a wafer surface. That is, the bowl-shaped warpage that is concave at the central part is given to the silicon wafer to be obtained by performing one or both of grinding and polishing in such a manner that a central point of a thickness at the wafer central part is placed at a position lower than the central point of the thickness at a wafer outer peripheral part. Further, as shown in FIG. 3, when obtaining an SOI wafer 21 based on a bonding method using this silicon wafer 12, an amount of the warpage is less than 0 μm (a negative value) in a so-called bow value. That is, when a surface having a concave shape is determined as a front surface side (an upper side), the concave warpage is formed so that a displacement amount (a distance A) from a three-point reference surface of a best-fit reference surface of a backside surface of a support substrate silicon wafer 12 that is not adsorbed and fixed to the central point in a thickness direction at the central part of the wafer 12 becomes less than 0 μm (a negative value).

The bowl-shaped warpage that is concave at the central part is formed to previously give warpage to the support substrate silicon wafer 12 so as to cancel out warpage that is produced in the SOI wafer 21 when performing a heat treatment at the time of bonding, then effecting cooling, and grinding or polishing a surface of one bonding silicon wafer 11 or when removing an oxide film on the backside surface of the SOI wafer. Furthermore, as to an amount of warpage provided to the support substrate silicon wafer 12, in case of the general SOI wafer 21 in which a diameter is 150 mm, a thickness of an SOI layer is 2 μm, a thickness of a Box layer as a buried oxide film layer is 1.0 μm, and a thickness of the support substrate silicon wafer 12 is 675 μm, it has been revealed from experiences that warpage of approximately 60 μm in a warp value is produced. Therefore, warpage of approximately −30 μm in the bow value must be given to the support substrate wafer 12 in advance. This amount of warpage fluctuates depending on respective thicknesses of the SOI layer, the Box layer, the support substrate silicon wafer 12, and the backside surface oxide layer of the SOI wafer 21 to be obtained.

It is to be noted that the warp is a value represented as a difference between a maximum displacement and a minimum displacement from the three-point reference surface or the best-fit reference surface to a central surface in the wafer thickness direction of the backside surface of the wafer that is not adsorbed and fixed.

On the other hand, uniformity of a thickness of this support substrate silicon wafer 12 is also important to obtain the SOI wafer 21 having a high degree of flatness. Therefore, the support substrate silicon wafer 12 according to the present invention must have a uniform thickness, and it is preferable for a specific variation of the thickness to fall within the range of 1 μm or below in a GBIR evaluation. That is because, when the GBIR exceeds 1 μm, a degree of flatness in the obtained SOI wafer 21 cannot be sufficiently increased.

On the other hand, FIGS. 2(a)-(b) show cross-sectional views of an example of obtaining an epitaxial silicon wafer 121. In this case, an epitaxial layer 111 is formed on a surface of a silicon wafer 112 having bowl-shaped warpage that is concave at a central part, thereby obtaining the epitaxial silicon wafer. This silicon wafer 112 is manufactured by performing one or both of grinding and polishing to a thin discoid silicon wafer 13 (FIG. 4) that is acquired by using, e.g., an inner diameter slicer or a wire saw device to slice a silicon single-crystal ingot which has boron doped therein to have a specific resistivity of 0.001 Ωcm to 0.1 Ωcm and is pulled up by a CZ method or an FZ method.

The bowl-shaped warpage that is concave at the central part is forcibly given to the epitaxial growth silicon wafer 112 by performing one or both of grinding and polishing in such a manner that a central point in a central surface of the thin discoid wafer in the thickness direction is placed at a position lower than a central point of a wafer circumference in the thickness direction, and a specific resistivity of this wafer falls within the range of 0.005 to 0.01 $\Omega$cm. Furthermore, it is preferable for its amount of warpage to fall within the range of −5 µm to −60 µm in a so-called bow value. That is, the concave warpage is formed so that a displacement amount (a distance A) from a three-point reference surface or a best-fit reference surface of a backside surface of the epitaxial growth silicon wafer 112 that is not adsorbed and fixed to a central point at the central part of the wafer 112 in the thickness direction falls within the range of −5 µm to −60 µm.

Forming the concave warpage in the epitaxial growth silicon wafer 112 corresponds to previously giving warpage to cancel out warpage that is produced in the epitaxial silicon wafer 121 due to formation of an epitaxial layer 111 when the epitaxial layer 111 is formed on a surface of this silicon wafer 112 to obtain the epitaxial silicon wafer 121.

On the other hand, uniformity of a thickness of this epitaxial growth silicon wafer 112 is also important to obtain the epitaxial silicon wafer 121 having a high degree of flatness. Therefore, the thickness of the epitaxial growth silicon wafer 112 according to the present invention must be uniform. As a specific variation of the thickness, a difference between the thickest part and the thinnest part preferably falls within the range of 1.0% of the thickest part, and more preferably falls within the range of 0.5%. That is because, when a difference between the thickest part and the thinnest part exceeds 1.0% of the thickest part, the warpage of the epitaxial growth silicon wafer 112 has such a shape that a part of the surface of this wafer is not uniform, or geometric conical warpage is not produced, and the degree of flatness in the obtained epitaxial silicon wafer 121 cannot be sufficiently increased.

Figure 4:
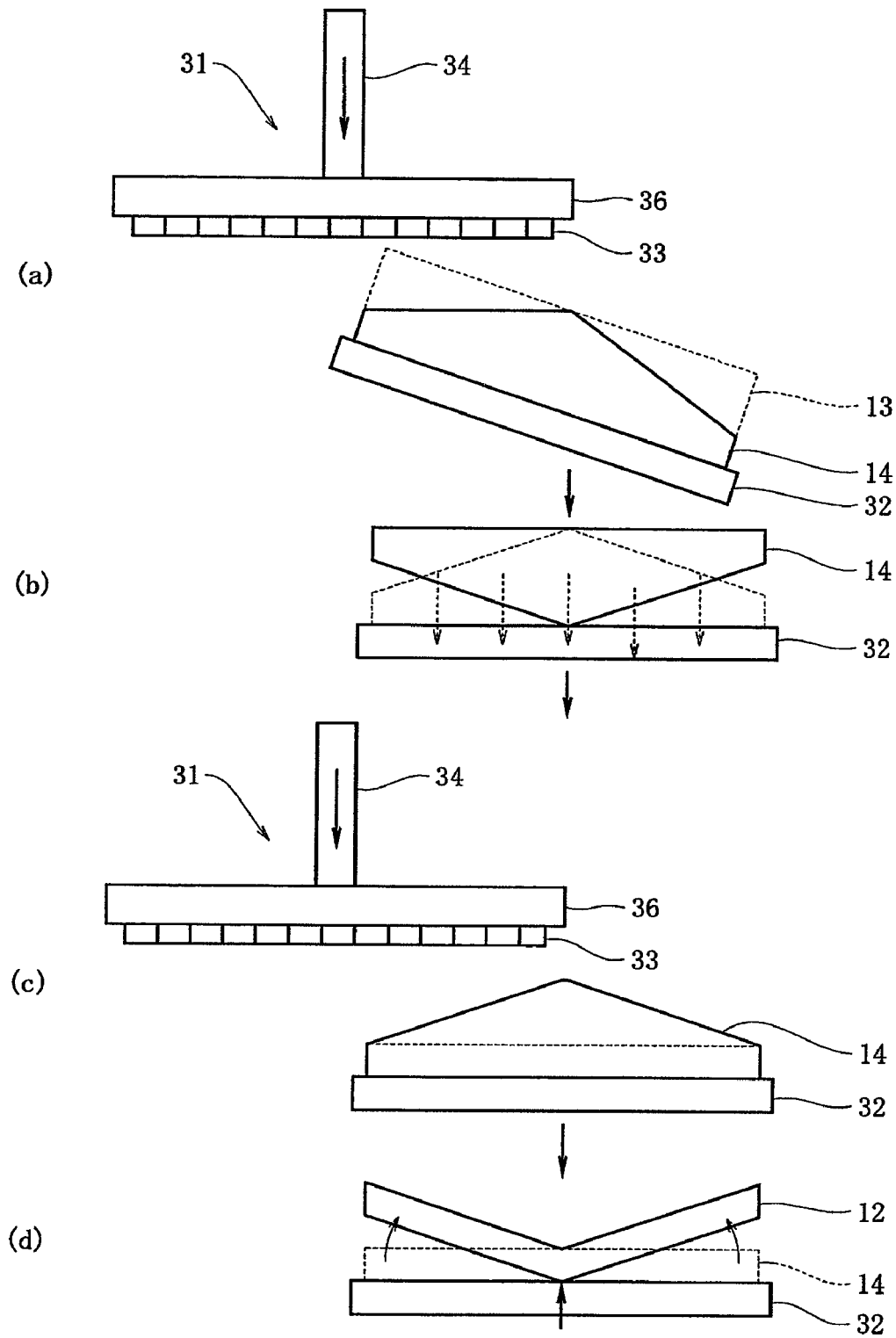
FIGS. 4(a)-(d) are partial cross-sectional views showing a manufacturing method of the silicon wafer.
Figure 5:
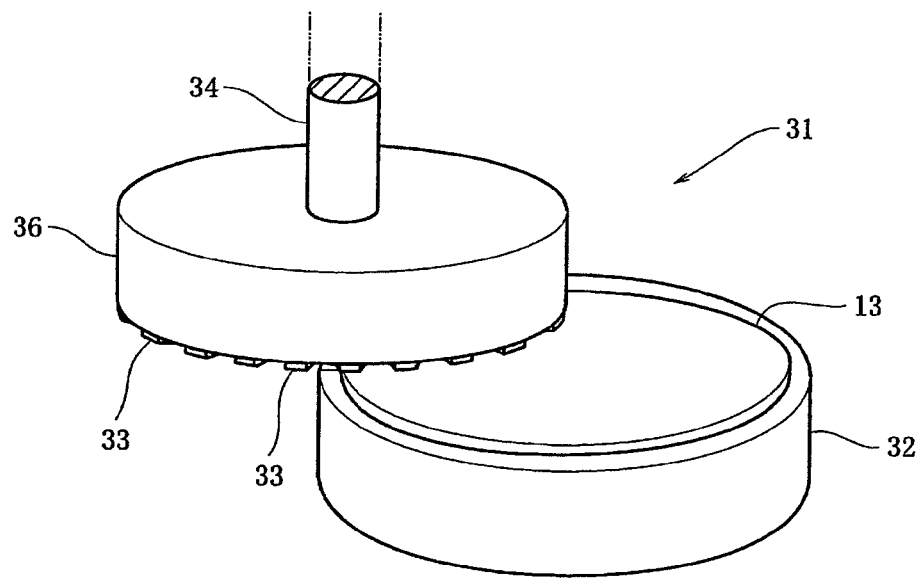
FIG. 5 is a perspective view of a primary part of a grinding device that is used to manufacture the silicon wafer.
Figure 6:
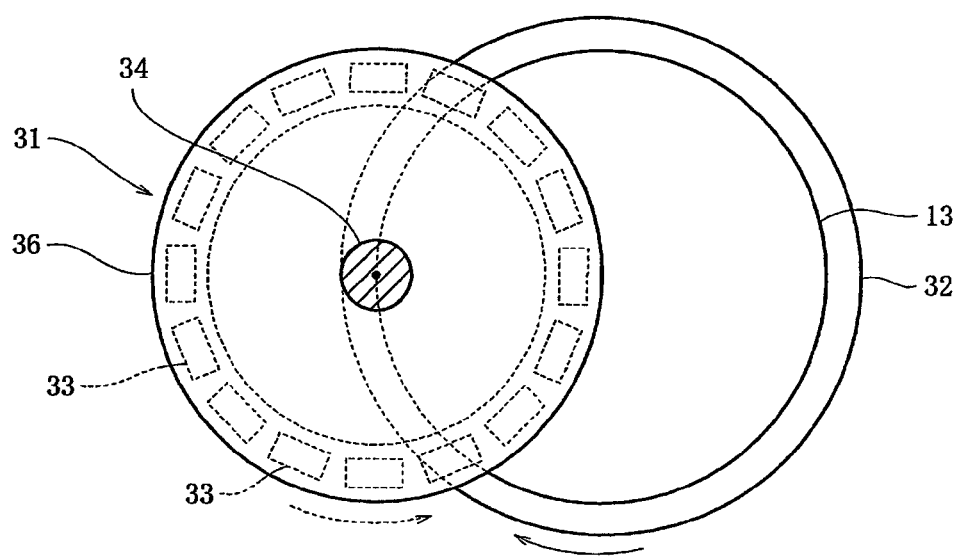
FIG. 6 is a plan view showing a relationship between grinding wheel of the grinding device and the wafer.

FIGS. 4(*a*)-(*d*) show cross-sectional views of a procedure of obtaining the silicon wafer 12 or 112 having the bowl-shaped warpage that is concave at the central part. Although obtaining the silicon wafer 12 having the bowl-shaped warpage that is concave at the central part will be described as a representative example with reference to FIG. 4, the procedure is the same when obtaining the epitaxial growth silicon wafer 112. That is, this silicon wafer 12 is obtained by grinding and polishing a discoid silicon wafer 13 by using a grinding device 31. FIGS. 5 to 8 show the grinding device 31 that is used to obtain this support substrate silicon wafer 12. This grinding device 31 includes a tabular holding table 32 which sucks the discoid silicon wafer 13 mounted on a flat upper surface and maintains the silicon wafer 13 in a state where its lower surface is forcibly flattened, a plurality of quadratic-prism-like grinding wheel 33 that grind an upper surface of the silicon wafer 13 held by this table 32, a grinding wheel holder 36 that holds these grinding wheel 33 so as to be placed on the same circumference with a rotary shaft 34 at the center, a rotating motor 37 (FIGS. 7 and 8) that rotates the grinding wheel holder 36 via the rotary shaft 34, and non-illustrated sliding means that holds this rotating motor 37 to allow its elevating motion. Here, as the grinding wheel 33, one obtained by bonding abrasive grains each having a grain size of approximately #300 through a metal bond is used for primary grinding, and one obtained by bonding abrasive grains each having a grain size of #1500 (an average particle diameter: 7.5 µm) to #10000 (an average particle diameter: 0.5 µm) through resin bond or a vitrifying bond is used for secondary grinding. This grinding wheel 33 functions as damage reducing means that suppresses a damage on a ground surface of the discoid silicon wafer 13 to 5 µm or below.

Figure 7:
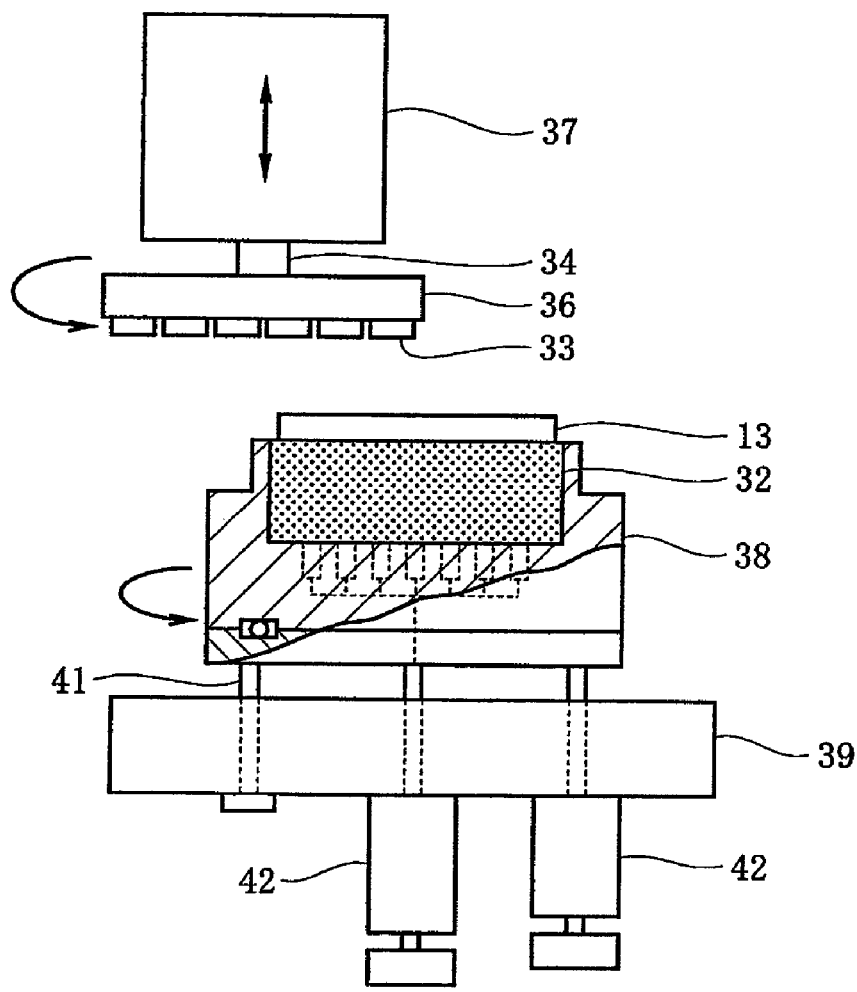
FIG. 7 is a block diagram of a grinding device having a horizontal holding table.
Figure 8:
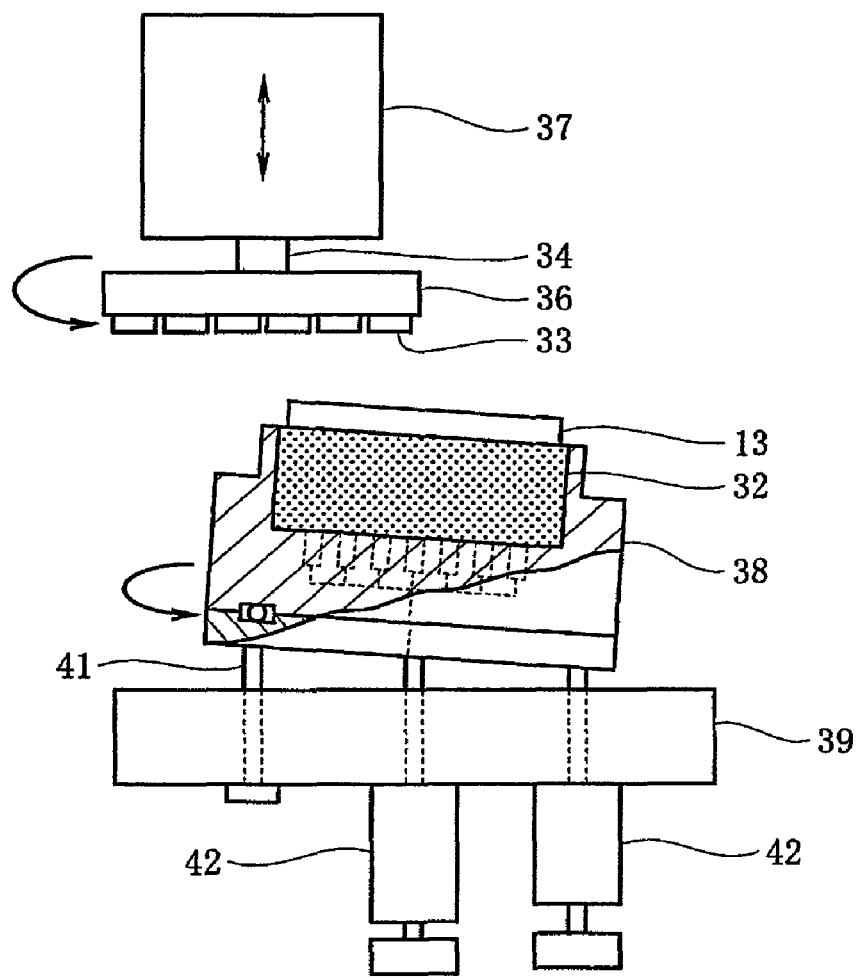
FIG. 8 is a block diagram associated with FIG. 7 showing a state where the holding table of the grinding device is inclined.

As shown in FIGS. 7 and 8, the holding table 32 is a circular plate formed of porous ceramics, and this holding table 32 is embedded in a support base 38. The support base 38 is supported by one fixed shaft 41 and two elevating shafts 42 and 42 above a fixed base 39. When a supporting point of the support base 38 is moved up and down by the two elevating shafts 42 and 42 to incline the support base 38, and a horizontal upper surface of the holding table 32 embedded in the support base 38 can be inclined at a desired angle. Further, non-illustrated rotating means that rotates the holding table 32 is provided to the support base 38, and this the holding table 32 can be rotated without changing an angle of the inclined upper surface in a state where the upper surface of the holding table 32 is inclined. Here, although the example where the holding table 32 is inclined has been explained, the rotary shaft 34 of the grinding wheel 33 may be inclined.

FIG. 4 shows a method of grinding and polishing the discoid silicon wafer 13 by the thus configured grinding device 31 to manufacture the silicon wafer 12. In FIG. 4, one main surface of the silicon wafer 13 is adsorbed and held and the other main surface of the same is subjected to one or both of grinding and polishing to manufacture a convex wafer 14 whose thickness is increased from a wafer outer periphery toward the water center, then the other main surface formed into a convex shape is adsorbed and held to protrude the center of one main surface side based on elastic deformation, the one main surface is subjected to one or both of grinding and polishing to provide the flat main surface, and adsorption and holding are released, thereby obtaining the wafer having bowl-shaped warpage that is concave at the central part. These steps will now be explained specifically hereinafter.

<Backside Surface Grinding Step>

First, the discoid silicon wafer 13 is prepared. This discoid silicon wafer 13 can be fabricated by slicing a silicon single-crystal rod pulled up based on a CZ method or an FZ method. As indicated by a broken line in FIG. 4(*a*), the surface of this discoid silicon wafer 13 is mounted on the tabular holding table 32, and the silicon wafer 13 is adsorbed by the holding table 32 with a backside surface of the silicon wafer 13 being determined as an upper surface. Then, the support base 38 having the holding table 32 embedded therein is inclined together with this holding table 32. The support base 38 is inclined by moving up and down the supporting point of the support base 38 by using the two elevating shafts 42 and 42 that support this supporting table 38, and the horizontal upper surface of the holding table embedded in this support base 38 is inclined at a desired angle as shown in FIG. 8. In this state, the holding table 32 is rotated together with the silicon wafer 13 in a direction indicted by a solid line arrow in FIG. 6, and the grinding wheel holder 36 is rotated in a direction of a broken line arrow in FIG. 6 by the rotating motor 37. Subsequently, the grinding wheel holder 36 is moved down to bring the grinding wheel 33 into contact with the backside surface of the silicon wafer 13, and this silicon wafer 13 is ground by the grinding wheel 33 from the backside surface side. Further, since the holding table 32 is inclined, the ground backside surface has an angular shape as indicated by a solid line in FIG. 4(*a*), and this silicon wafer 13 becomes an intermediate wafer 14 whose backside surface has a protruding center so that the center thereof has a large thickness.

In case of obtaining the epitaxial growth silicon wafer 112, since the intermediate wafer 14 having a conical concave surface like a sharpened central edge formed thereon has a tendency that the nano-topography is degraded at the wafer central part in a surface flatness evaluation after epitaxial growth, it is desirable to grind the wafer into a concave shape in such a manner that the entire concave surface has a gentle curved shape.

<Surface Grinding Step>

Then, the silicon wafer 13 is ground from the front surface side. To perform this step, the intermediate wafer 14 ground to protrude the center of the backside surface thereof is removed from the holding table 32. Further, the backside surface having the protruding center is mounted on the holding table 32 as indicated by a solid line in FIG. 4(b), the backside surface is adsorbed to hold the intermediate wafer 14 on the flat upper surface of the holding table 32 as indicated by broken line arrows. Then, as indicated by a broken line in FIG. 4(b), since the upper surface of the holding table 32 is flat, the backside surface of the intermediate wafer 14 is elastically deformed to become flat in a state where it is adsorbed by the holding table, and the center of the front surface of the intermediate wafer 14 contrarily protrudes upward. Moreover, before or after the backside surface of the intermediate wafer 14 is adsorbed and held by the holding table 32, the supporting point of the support base 38 is moved up and down by the two elevating shafts 42 and 42 that support the support base 38 to restore the support base 38 to the horizontal state as shown in FIG. 7, and the upper surface of the holding table 32 embedded in the support base 38 is restored to the horizontal state.

Then, the holding table 32 is rotated together with the intermediate wafer 14, and the grinding wheel holder 36 is also rotated by the rotating motor 37. Subsequently, the grinding wheel holder 36 is moved down in a direction of a solid line arrow in FIG. 4(c), and the grinding wheel 33 are brought into contact with the front surface of the intermediate wafer 14 to grind the intermediate wafer 14 with the grinding wheel 33 from the front surface side. Additionally, since the holding table 32 is restored to the horizontal state, the ground surface becomes parallel to the holding table 32 and has a uniform thickness as indicated by a broken line. When the intermediate wafer 14 having such a uniform thickness is removed from the holding table 32, the wafer 14 is restored by elasticity as indicated by an arrow in FIG. 4(d), thus obtaining the silicon wafer 12 having the bowl shape that is concave at the center of the front surface thereof and also having the uniform thickness.

Here, the bowl-shaped silicon wafer 12 that is concave at the central part includes a wafer that is ground into a concave shape in such a manner that an entire concave surface has a gentle curved surface, a wafer having a concave shape that is slightly corrugated in a circumferential direction, a wafer having a substantially conical shape, and others.

According to such a manufacturing method of a silicon wafer, it is possible to obtain the silicon wafer 12 with the concave warpage given thereto in such a manner that a central point of a thickness at the wafer central part is placed at a position lower than a central point of a thickness at the wafer outer peripheral part.

It is to be noted that the procedure of the surface grinding step when manufacturing the convex intermediate wafer 14 whose backside surface protrudes at the center in such a manner that the center of the silicon wafer 13 has a large thickness and the backside surface grinding step when using this convex wafer has been explained as the surface grinding step and the backside surface grinding step in the embodiment according to the present invention. However, even if the concave intermediate wafer 14 whose backside surface is hollow at the center in such a manner that the silicon wafer 13 has a small wall thickness at the center is first fabricated and then the convex silicon wafer 14 with the uniform thickness is manufactured, this wafer can be used as the same concave silicon wafer 12 when inverted. Contrary, when the concave wafer is fabricated and then inverted, this wafer can be used as the convex wafer. In short, using a wafer having warpage in a direction opposite to a direction of warpage of the SOI wafer as a support substrate can suffice in manufacture of the SOI wafer, and using a wafer having warpage in a direction opposite to warpage of the epitaxial wafer as a front-surface-side wafer can suffice in epitaxial growth processing.

Moreover, the example of using the grinding device 31 to process the wafer at each grinding step has been explained. However, using a known mirror polishing device in place of the grinding device 31 enables obtaining the same silicon wafer having bowl-shaped warpage that is concave at a central part, and both the grinding device and the mirror polishing device can be used. In this case, a mirror polishing step before fabrication of the SOI wafer can be omitted, and the mirror polishing step before epitaxial growth processing can be also omitted.

A manufacturing method of the SOI wafer 21 using the silicon wafer 12 having the bowl-shaped warpage that is concave at the central part as the support substrate will now be explained in detail with reference to FIG. 3.

As shown in FIG. 3(a), one or both of grinding and polishing are performed to the thin discoid wafer to prepare the silicon wafer 12 having the bowl-shaped warpage that is concave at the central part as the support substrate. A bonding silicon wafer 11 is additionally prepared. The bonding silicon wafer 11 is fabricated by slicing a silicon single-crystal ingot pulled up by the CZ method or the FZ method. It is to be noted that FIG. 3 shows the support substrate silicon wafer 12 with larger warpage than actual warpage to facilitate understanding.

Subsequently, as shown in FIG. 3(b), an insulating layer 11a is formed on an entire surface of the bonding silicon wafer 11 to which warpage is not forcibly given. Although depending on an intended purpose of an SOI to be fabricated, a thickness of this insulating layer 11a falls within the range of approximately 0.5 to approximately 2.0 μm, or preferably the range of approximately 0.5 to approximately 1.0 μm. Moreover, the insulating layer 11a is a silicon oxide layer (an $SiO_2$ layer), and it is formed by thermally oxidizing the silicon wafer 11 or formed based on a CVD method. It is to be noted that the example based on thermal oxidation has been explained in this embodiment, and hence the insulating layer 11a is formed on the entire surface of the bonding silicon wafer 11. However, according to the CVD method, the insulating layer 11a may be formed on both surfaces or one surface of the bonding silicon wafer 11 excluding side surfaces thereof.

Then, as shown in FIG. 3(c), the insulating layer 11a directly formed on this bonding silicon wafer 11 is used as a bonding surface, and this bonding silicon wafer 11 is bonded to the surface of the support substrate silicon wafer 12 that is concave at the center. Here, in order to activate the surface of the support substrate silicon wafer 12 that is concave at the center, it is preferable to clean this surface with an SC1 (Standard Cleaning 1) cleaning liquid as a mixed aqueous solution containing $NH_4OH$ and $H_2O_2/H_2O$. Additionally, the support substrate silicon wafer 12 and the bonding silicon wafer 11 after bonded as shown in FIG. 3(d) are subjected to a heat treatment in a drying oxygen (dry $O_2$) atmosphere or a nitrogen ($N_2$) atmosphere at a temperature of 1100° C. for 1 to 3 hours, or preferably approximately 2 hours.

Further, as shown in FIG. 3(e), the integrated two silicon wafers 11 and 12 are cooled to a room temperature, and then the bonding silicon wafer 11 which will serve as the SOI layer is ground with the grinding wheel, polished with a polishing pad while flowing a polishing agent, and formed into a thin film with a thickness of approximately 1 to 20 μm. As a result, the SOI wafer 21 having a device formation SOI layer 11b with a thickness of approximately 1 to 20 μm formed on the insulating layer 11a.

The thus obtained SOI wafer 21 has no oxide film present on a backside surface thereof, or has a smaller thickness of a backside surface oxide film than a thickness of the BOX layer. Further, warpage given to the support substrate silicon wafer 12 cancels out warpage that is produced on a stage where the bonding silicon wafer 11 serving as the SOI layer with the grinding wheel, thus acquiring the flat SOI wafer 21. Therefore, in this SOI wafer 21, the oxide film is not removed in a device process, and new warpage can be effectively prevented from occurring in the device process.

It is to be noted that, when the silicon wafer having bowl-shaped warpage that is concave at the central part is used as the support substrate, respectively mirror-polishing the concave warped surface of the support substrate wafer and the surface of the active layer substrate silicon wafer which are bonded to each other through at least the oxide film is preferable.

Figure 2:
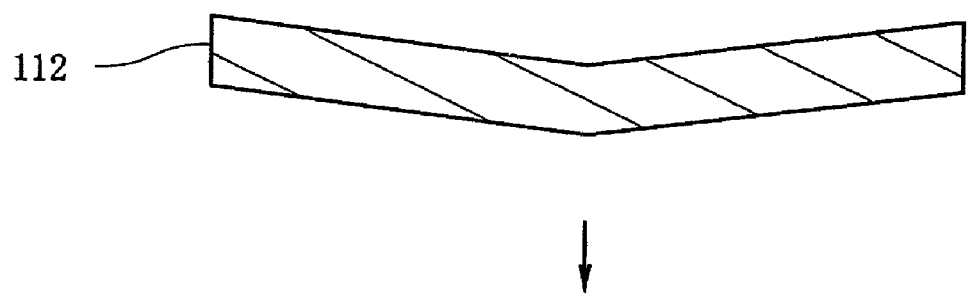
FIGS. 2(a)-(b) are partial cross-sectional views showing a manufacturing method of an epitaxial silicon wafer using the silicon wafer.
Figure 2:
Figure 2:
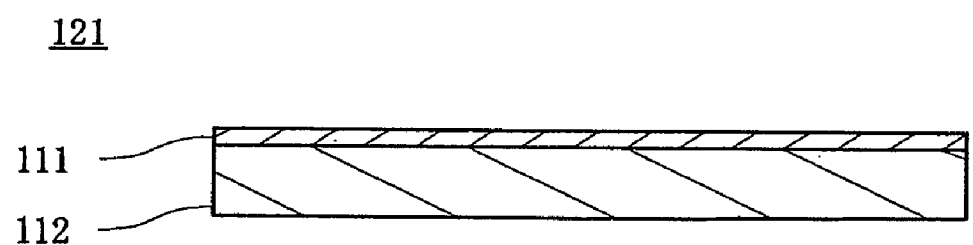

A manufacturing method of the epitaxial silicon wafer 121 using the silicon wafer 112 having the bowl-shaped warpage that is concave at the central part as shown in FIG. 2 will now be explained hereinafter in detail.

As shown in FIG. 2(a), the thin discoid wafer is subjected to one or both of grinding and polishing to prepare the epitaxial growth silicon wafer 112 having the bowl-shaped warpage that is concave at the central part. The epitaxial growth silicon wafer 112 can be obtained based on the above-explained manufacturing procedure. It is to be noted that FIG. 2 shows the epitaxial growth silicon wafer 112 with larger warpage than actual warpage to facilitate understanding.

Subsequently, as shown in FIG. 2(b), an epitaxial layer 111 is formed on a front surface (an upper surface in FIG. 2(b)) of the concave epitaxial growth silicon wafer 112 to obtain the epitaxial silicon wafer 121. The epitaxial layer 111 can be formed by growing the epitaxial layer 111 based on a vapor growth method in a temperature range of 400 to 1200° C. while supplying a raw material gas together with a carrier gas to the surface of the epitaxial growth silicon wafer 112. Moreover, it is desirable to mirror-polish the surface of the epitaxial growth silicon wafer 112 before forming the epitaxial layer 111. Here, as the raw material gas, there is, e.g., $SiH_2Cl_2$, $SiHCl_3$, $SiH_4$, or $SiCl_4$, and $H_2$ can be mainly used as the carrier gas.

As the raw material gas that is supplied to form the epitaxial layer 111 as a film, a mixed gas containing a semiconductor source gas and a halide gas can be also used. Here, as the semiconductor source gas, there are monosilane ($SiH_4$), disilane ($Si_2H_6$), dichlorosilane ($SiH_2Cl_2$), trichlorosilane ($SiHCl_3$), silicon tetrachloride ($SiCl_4$), and others. In particular, it is preferable to use one of dichlorosilane ($SiH_2Cl_2$), trichlorosilane ($SiHCl_3$), and silicon tetrachloride ($SiCl_4$) as the semiconductor source gas. As the halide gas, it is preferable to use one of hydrogen chloride (HCl), chloride ($Cl_2$), fluorine ($F_2$), chlorine trifluoride ($ClF_3$), hydrogen fluoride (HF), and hydrogen bromide (HBr), and using hydrogen chloride (HCl) is preferable in particular.

When one or both of grinding and polishing are performed with respect to the thin discoid wafer to form the epitaxial layer 111 on the surface of the epitaxial growth silicon wafer 112 having the bowl-shaped warpage that is concave at the central part, the epitaxial silicon wafer 121 can be obtained.

In the thus obtained epitaxial silicon wafer 121, the warpage given to the epitaxial growth silicon wafer 112 cancels out the warpage that is produced due to formation of the epitaxial layer 111, thus acquiring the flat epitaxial silicon wafer 121. Therefore, in this epitaxial silicon wafer 121, mask matching or holding using a vacuum chuck in a device manufacturing process can be prevented from becoming complicated.

EXAMPLE

Examples according to the present invention in wafers to be bonded will now be explained hereinafter in detail with reference to the accompanying drawings.

Example 1

First, a silicon single-crystal ingot pulled up by the CZ method was sliced by a wire saw to obtain 25 thin discoid silicon wafers 13 each having a diameter of 200 mm (8 inches). All the silicon wafers were fabricated into support substrate silicon wafers 12 each having bowl-shaped warpage that is concave at a central part based on the procedure depicted in FIG. 4. That is, a front surface of each thin discoid silicon wafer 13 was adsorbed and held on a flat upper surface of a holding table 32, and the silicon wafer 13 was ground from a backside surface side so as to have a large thickness at the center, thereby obtaining an intermediate wafer 14 whose backside surface is protruded approximately 30 μm at the center. Then, the intermediate wafer 14 was removed from the holding table 32, and the backside surface protruding at the center was adsorbed and held on the flat upper surface of the holding table 32 to protrude the center of the front surface of the intermediate wafer 14 upwards based on elastic deformation. The intermediate wafer 14 was ground from the front surface side so as to provide a uniform thickness whose variation in a wafer surface is 1 μm or below. Then, the intermediate wafer 14 having the uniform thickness was removed from the holding table 32 to be restored based on elasticity. As a result, the 25 support substrate silicon wafers 12 each having the bowl-like shape that is concave at the center of the front surface and also having the uniform thickness was obtained.

Figure 9:
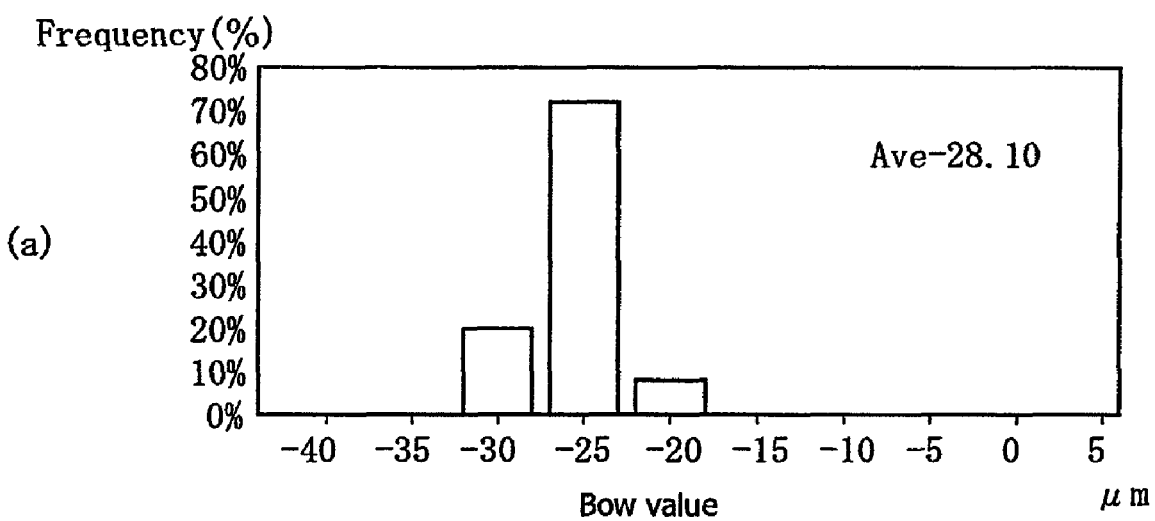
FIG. 9(a) is a view showing a warpage distribution state represented by so-called bow values of a support substrate silicon wafer according to Example 1.
FIG. 9(b) is a view showing a warpage distribution state represented by so-called warp values of an SOI wafer obtained by using the support substrate silicon wafer.
Figure 9:
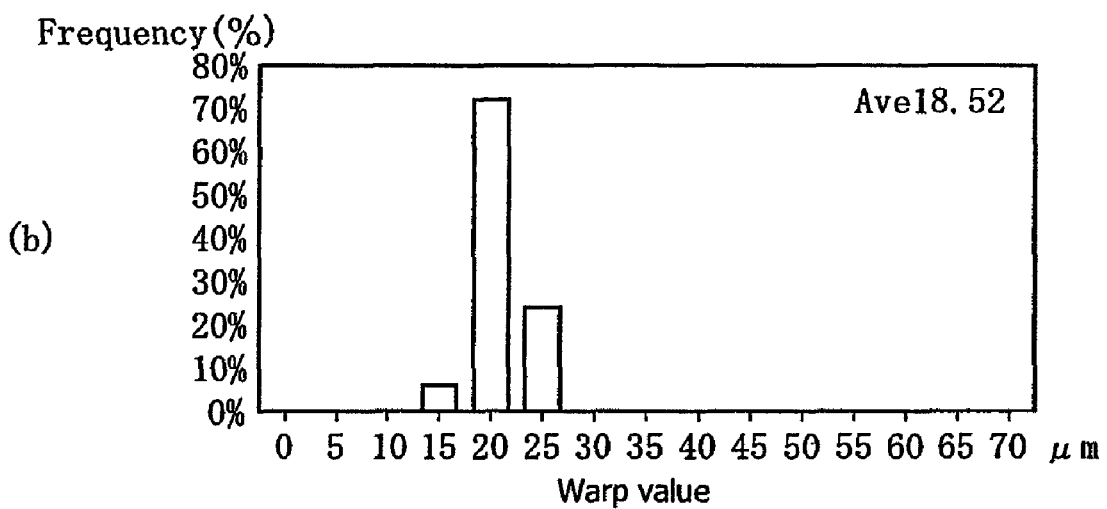

Warpage of each of the 25 support substrate silicon wafers 12 was measured by a flatness-measuring instrument manufactured by ADE Corporation, and FIG. 9(a) shows its distribution. A warpage distribution in FIG. 9(a) shows a warpage distribution represented by so-called bow values, and this bow value is a value represented as a maximum distribution amount from a three-point reference surface or a best-fit reference surface of a backside surface of the support substrate silicon wafer 12 that is not adsorbed and fixed to a central point at a central part of the wafer 12 in a thickness direction when the concave surface is determined as a front surface side (an upper side).

Then, a silicon single-crystal ingot pulled up by the CZ method was sliced by a wire saw to additionally prepare 25 bonding silicon wafers 11. This bonding silicon wafer 11 has a diameter of 200 mm (8 inches) and a thickness of approximately 725 μm. Further, this bonding silicon wafer 11 was subjected to a heat treatment in a wet oxygen (wet $O_2$, $O_2$:$H_2$=2.0 liters/minute: 1.0 liters/minute) atmosphere at 1000° C. for 3 hours to form an insulating layer 11a made of a silicon oxide layer ($SiO_2$) having a thickness of 0.5 μm on an entire surface of this wafer 11.

The bonding silicon wafer 11 having the insulating layer 11a formed thereon and the support substrate silicon wafer 12 were cleaned with an SC1 (Standard Cleaning 1) cleaning liquid which was prepared by mixing an aqueous solution of $NH_4OH$ having a specific gravity of 0.9, an aqueous solution of $H_2O_2$ having a specific gravity of 1.1, and $H_2O$ at a capacity ratio of $NH_4OH:H_2O_2:H_2O=1:2:7$ and maintained at approximately 80° C., and then the bonding silicon wafer 11 was superimposed on and bonded to the surface of the support substrate silicon wafer 12 that is concave at the center with the insulating layer 11a of the wafer 11 being determined as a bonding surface as shown in FIG. 3(c).

As depicted in FIG. 3(d), the thus bonded wafers 11 and 12 were put into a heat treatment furnace set to a room temperature to 800° C. at a speed of 10 to 15 cm/minute, and the temperature was increased from 800° C. in a nitrogen atmosphere at a speed of 10° C./minute. When the temperature reached 1100° C., it was maintained for 2 hours, then it was reduced to 800° C. at a speed of 4° C./minute, and the wafers were taken out to the room temperature from the furnace at a speed of 10 to 15 cm/minute. Subsequently, as shown in FIG. 3(c), the surface of the bonding silicon wafer 11 was ground with grinding wheel, polished with a soft polishing pad while flowing a polishing agent, and an SOI layer 11b having a thickness of 1 to 20 μm was formed on the insulating layer 11a, thereby obtaining an SOI wafer 21. This SOI wafer 21 was determined as Example 1.

Comparative Example 1

Figure 10:
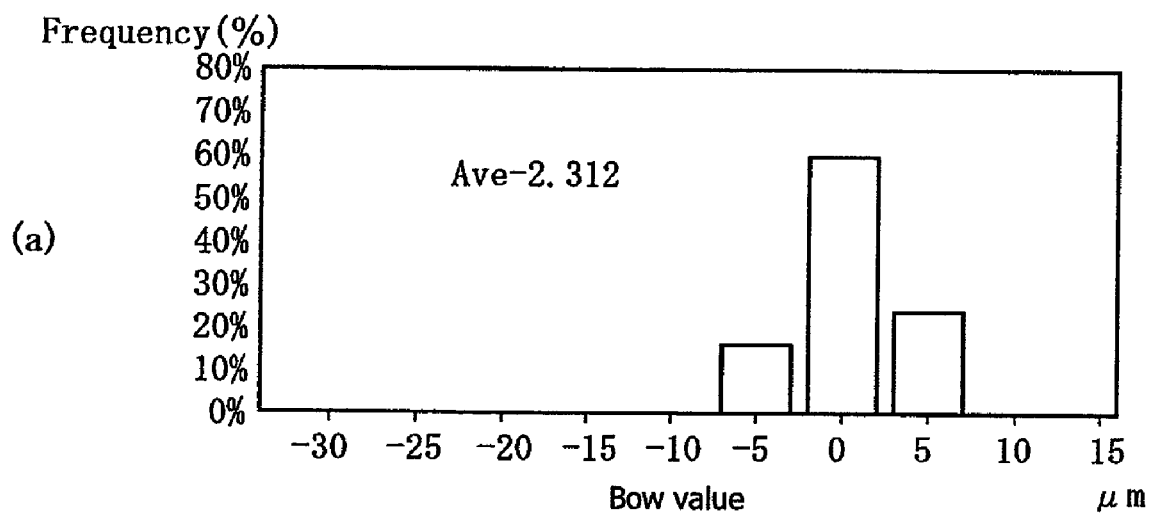
FIG. 10(a) is a view showing a warpage distribution state represented by so-called bow values of a discoid support substrate silicon wafer according to Comparative Example 1.
FIG. 10(b) is a view showing a warpage distribution state represented by so-called warp values of an SOI wafer obtained by using the silicon wafer.
Figure 10:
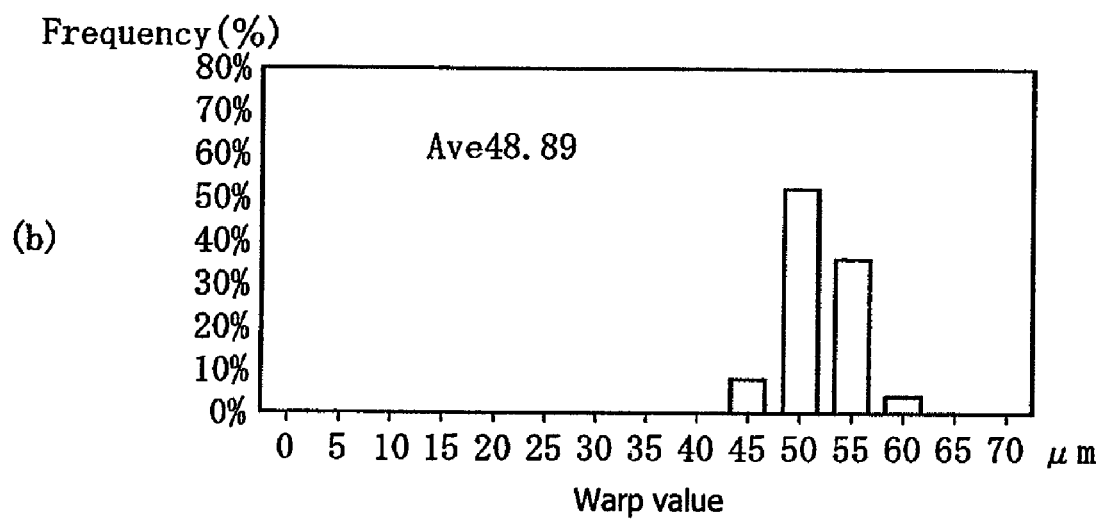

Although not shown, a silicon single-crystal ingot pulled up by the CZ method was sliced by a wire saw to additionally prepare 25 thin discoid support substrate silicon wafers. This thin discoid support substrate silicon wafer has a diameter of 200 mm (8 inches) and a thickness of approximately 725 μm. Warpage of each of the 25 thin discoid support substrate silicon wafers was measured by the flatness-measuring instrument manufactured by ADE Corporation, and FIG. 10(a) shows its distribution. The warpage distribution in FIG. 10(a) shows a warpage distribution represented by bow values like FIG. 9(a).

On the other hand, the same 25 bonding silicon wafers as Example 1 were prepared, and an insulating layer made of a silicon oxide layer ($SiO_2$) with a thickness of 0.5 μm was formed on an entire surface of each bonding silicon wafer under the same conditions as Example 1. Then, the bonding silicon wafer having the insulating layer formed thereon was superimposed on and bonded to the thin discoid support substrate silicon wafer under the same conditions as Example 1. Moreover, both the bonded wafers were subjected to a heat treatment under the same conditions as Example 1 and then taken out into a room temperature from the furnace. Subsequently, the surface of the bonding silicon wafer having the insulating layer formed thereon was ground with the grinding wheel and then polished with a soft polishing pad while flowing a polishing agent, and an SOI layer having a thickness of 0.1 to 10 μm was formed on the insulating layer, thereby obtaining an SOI wafer. This SOI wafer was determined as Comparative Example 1.

<Comparative Test and Evaluation>

Warpage of each of the 25 SOI wafers 21 according to Example 1 and the 25 SOI wafers according to Comparative Example 1 was measured by the flatness-measuring instrument manufactured by ADE Corporation, and FIGS. 9(b) and 10(b) show their distributions. The warpage distributions in FIGS. 9(b) and 10(b) show warpage distributions represented by so-called warp values, and this warp value is a value represented as a difference between a maximum displacement and a minimum displacement from a three-point reference surface or a best-fit reference surface of a backside surface of a wafer that is not adsorbed and fixed to a central surface in a wafer thickness direction.

Here, the warpage distribution in each of FIGS. 9(a) and 10(a) is represented by bow values so that a height level of irregularities can be recognized and the warpage distribution in each of FIGS. 9(b) and 10(b) is represented by warp values because a warp value in which the warpage distribution of the entire wafer is reflected is generally used as a specification of the wafer warpage. As apparent from FIGS. 9(a) and 10(a), warpage (bow values) of the silicon wafers serving as the support substrates falls within the range of −5 μm to +5 μm and its average value is −2.3 μm in Comparative Example 1. However, in Example 1, warpage is concentrated in the range of −20 μm to −30 μm and its average value is −28.1 μm, thereby obtaining a warpage amount that is relatively stable on a negative side.

On the other hand, as apparent from results in FIGS. 9(b) and 10(b), warpage of the SOI wafers 21 represented by so-called warp values in Example 1 is concentrated on 20 μm, and its average value is 18.5 μm. However, warpage of the SOI wafers represented by so-called warp values in Comparative Example 1 is concentrated on 50 μm that is a larger value than that in Example 1, and its average value is 48.9 μm. That is, it can be understood that each SOI wafer 21 according to Example 1 has a smaller flat warpage (warp) value than that of each SOI wafer according to Comparative Example 1. It can be considered that this value is small because the concave warpage formed in the support substrate silicon wafer 12 according to Example 1 cancels out warpage that is produced when the SOI wafer 21 is obtained, and the effect of the present invention was confirmed.

An example of the present invention when obtaining the epitaxial silicon wafer will now be explained in detail with reference to the accompanying drawings.

Example 2

First, a silicon single-crystal ingot having boron doped therein was pulled up by the CZ method. Then, this ingot was sliced by using a non-illustrated wire saw device to obtain 50 thin discoid silicon wafers 13 each having a diameter of 300 mm. These wafers were all formed into epitaxial growth silicon wafers 12 each having conical warpage based on the procedure depicted in FIG. 4. That is, a surface of each thin discoid silicon wafer 13 was adsorbed and held on a flat upper surface of a holding table 32, and the wafer was ground from a backside surface side so as to have a large thickness at the center, thereby obtaining an intermediate wafer 14 protruding approximately 10 μm at the center of the backside surface. Then, the intermediate wafer 14 was removed from the holding table 32, the backside surface protruding at the center was adsorbed and held on the flat upper surface of the holding table 32, and the center of the front surface of the intermediate wafer 14 was upwardly protruded based on elastic deformation. This intermediate wafer 14 was ground from the front surface side to have a uniform thickness in such a manner that a variation of the thickness in the wafer surface is 1 μm or below.

Thereafter, each intermediate wafer 14 having the uniform thickness was removed from the holding table 32 and restored based on resistivity, thereby obtaining 50 epitaxial growth silicon wafers 112 each having a bowl-like shape that is concave at a central part of the front surface and also having a uniform thickness.

Figure 11:
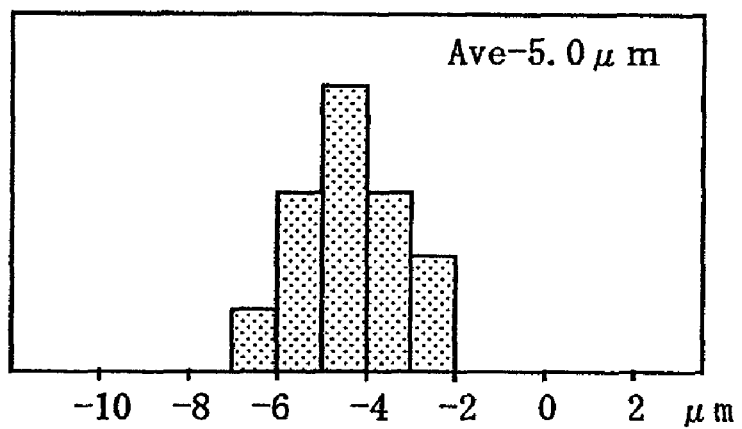
FIG. 11(a) is a view showing a warpage distribution state represented by so-called warp values of an epitaxial growth silicon wafer according to Example 2.
FIG. 11(b) is a view showing a warpage distribution state represented by so-called warp values of an epitaxial silicon wafer obtained by using the epitaxial growth silicon wafer.
Figure 11:
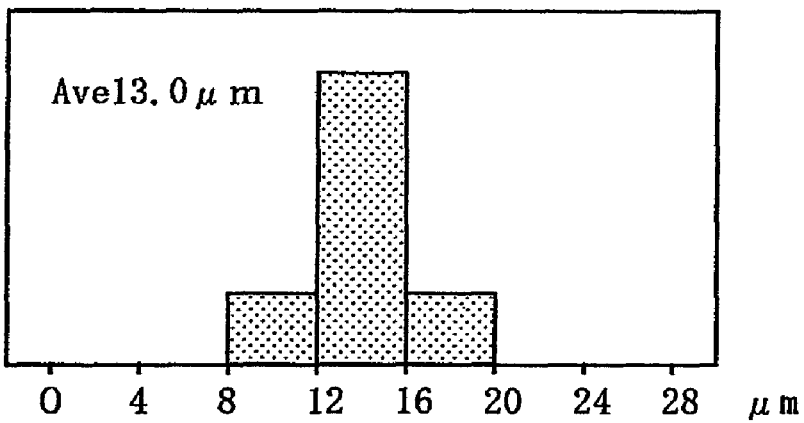

When a specific resistivity of each of the 50 epitaxial growth silicon wafers 112 was measured by a four-probe resistivity measuring instrument, a result was 0.006 to 0.009 Ωcm, and this value falls within the range of 0.05 to 0.01 Ωcm. Further, warpage of each of the 50 epitaxial growth silicon wafers 112 was measured by the flatness-measuring instrument manufactured by the ADE Corporation. FIG. 11(a) shows its result. Additionally, an average value of the warpage was approximately −5 μm in the form of a bow value. This bow value is a value represented as a displacement amount from a three-point reference surface or a best-fit reference surface of the backside surface of the epitaxial growth silicon wafer 112 that is not adsorbed and fixed to a central point at the central part of the wafer 112 in a thickness direction when the concave surface is determined as a front surface side (an upper side). It can be considered that this bow value is approximately −5 μm because the center of the backside surface of the intermediate wafer 14 was protruded approximately 10 μm.

Figure 13:
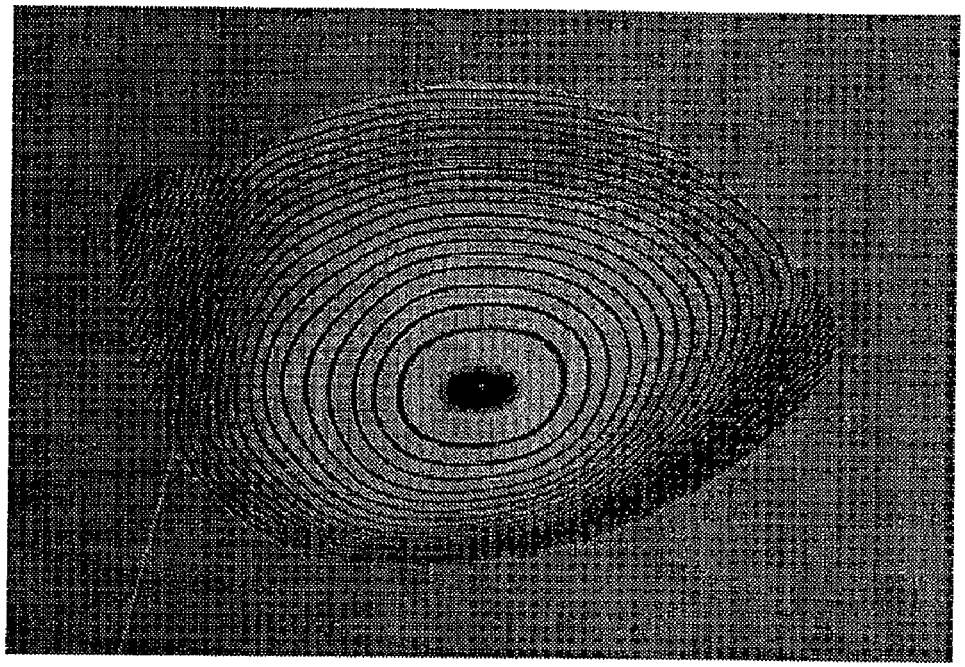
FIG. 13 is a photographic view showing a state of a surface of the epitaxial growth silicon wafer according to Example 2.

Further, a warpage status of a surface of arbitrary one selected from the 50 wafers was observed by using the flatness-measuring instrument manufactured by the ADE Corporation. FIG. 13 shows this warpage situation. As apparent from FIG. 13, the surface shape of the epitaxial growth silicon wafer 112 according to this example is a fair bowl-like surface that is concave at the central part, and it can be considered that the fair surface shape is provided because mechanical grinding and polishing were performed with respect to this surface.

Then, the surface of each of these epitaxial growth silicon wafers was mirror-polished so as to have a thickness of 775 μm. In regard to this mirror polishing, it is desirable to mirror-polish at least the front surface side on which an epitaxial layer is formed, and both the front and backside surfaces of the wafer may be mirror-polished by using a double-side polishing machine that can simultaneously mirror-polish the front and backside surfaces of the wafer.

Subsequently, an epitaxial layer 111 was formed on a the concave surface of the epitaxial growth silicon wafer 112 having the bowl-shaped warpage that is concave at the center as shown in FIG. 2, thereby obtaining an epitaxial silicon wafer 121. The epitaxial layer 111 was formed by using a non-illustrated reaction container. The epitaxial growth silicon wafer 112 was supported in the reaction container, SiHCl$_3$ as a raw material gas was introduced together with H$_2$ as a carrier gas into the reaction container through a gas introducing tube and a gas supply opening of the reaction container to form the epitaxial layer 111 having a specific resistivity of approximately 1 Ωcm and a thickness of 3 μm on the surface of the epitaxial growth silicon wafer 112 while heating the epitaxial growth silicon wafer 112. Each epitaxial silicon wafer 121 having the epitaxial layer 111 formed on the concave surface of the epitaxial growth silicon wafer 112 was determined as Example 2.

Comparative Example 2

Like Example 2, a silicon single-crystal ingot having boron doped therein was pulled up by the CZ method. Then, this ingot was sliced by using a non-illustrated wire saw device to prepare 50 thin discoid silicon wafers. A surface of each thin discoid silicon wafer was mirror-polished to obtain an epitaxial growth silicon wafer having a diameter of 300 mm and a thickness of approximately 775 μm. That is, in this comparative example, warpage is not forcibly produced after slicing the ingot by using the wire saw device.

Figure 12:
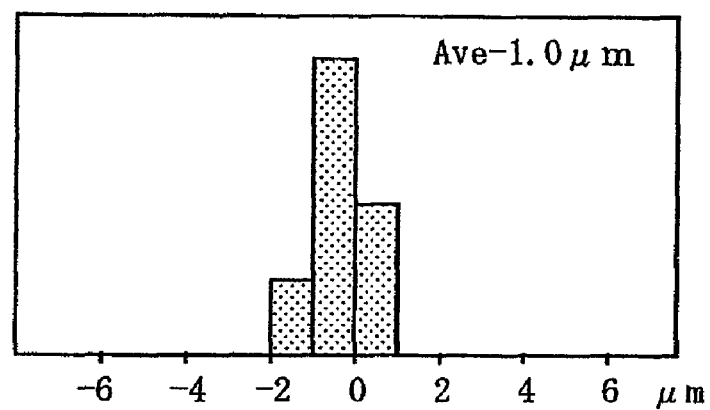
FIG. 12(a) is a view showing a warpage distribution state represented by so-called bow values of a tabular epitaxial growth silicon wafer according to Comparative Example 2.
FIG. 12(b) is a view showing a warpage distribution state represented by so-called warp values of an epitaxial silicon wafer obtained by using the silicon wafer.
Figure 12:
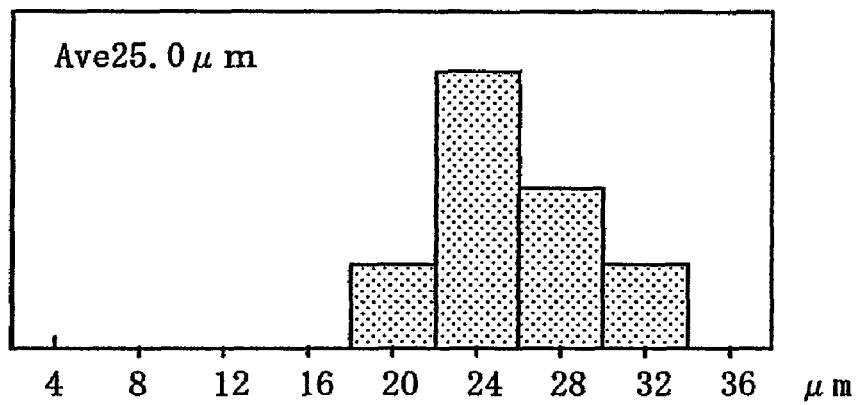

When a specific resistivity of each of the 50 epitaxial growth silicon wafers 112 was measured by a four-probe resistivity-measuring instrument, the specific resistivity was 0.006 to 0.009 Ωcm like the example, and this value falls within the range of 0.005 to 0.01 Ωcm. Furthermore, warpage of each of the 50 thin discoid epitaxial growth silicon wafers was measured by the flatness-measuring instrument manufactured by ADE Corporation. FIG. 12(a) shows its result. Moreover, an average value of the warpage was approximately −1 μm in the form of a bow value. It can be considered that the warpage of approximately −1 μm is represented by the bow value is provided as a value of general warpage that is produced at the time of slicing using the wire saw device.

Figure 14:
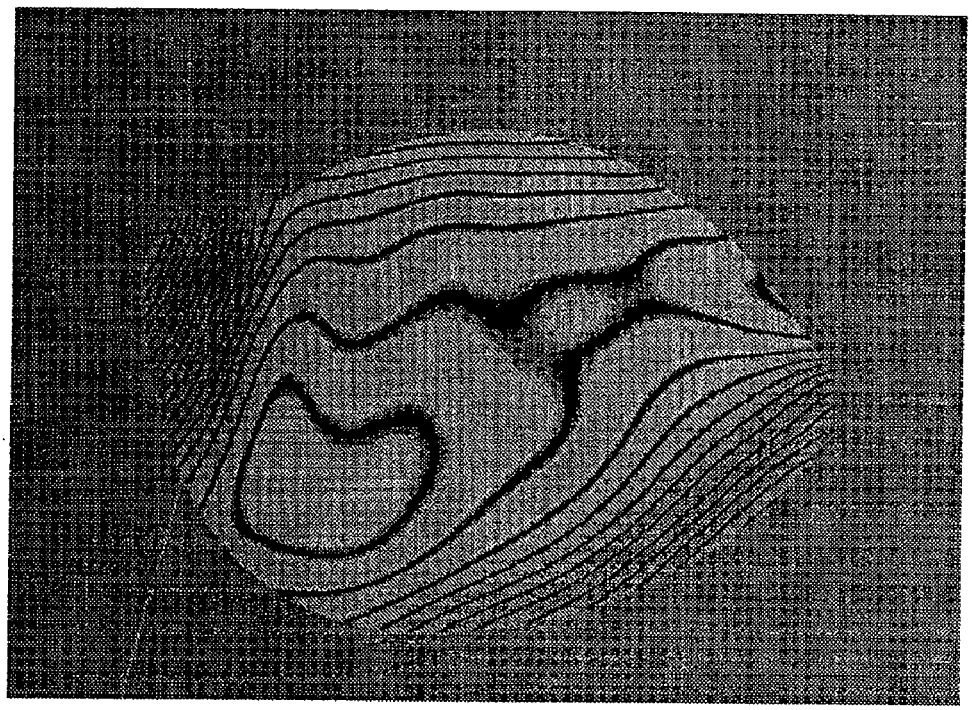
FIG. 14 is a photographic view showing a state of the surface of the epitaxial growth silicon wafer according to Comparative Example 2.

Additionally, a warpage status of a surface of arbitrary one selected from the 50 wafers was observed by using the flatness-measuring instrument manufactured by the ADE Corporation. FIG. 14 shows this warpage status. As apparent from FIG. 14, it can be understood that the surface shape of the epitaxial growth silicon wafer according to this comparative example has a warpage size in a diameter direction which varies depending on respective directions and it does not have the bowl-shaped surface that has a fair curved surface in a circumferential direction and is concave at the central part. It can be considered that such a surface shape is provided because an amount of warpage in a moving direction perpendicular to a traveling direction of a wire for slicing the ingot is relatively large even though an amount of warpage in the traveling direction of the wire in the wire saw device used to slice the ingot is relatively small.

Subsequently, an epitaxial layer having a specific resistivity of approximately 1 Ωcm and a thickness of 3 μm was formed on the surface of each epitaxial growth silicon wafer based on the same conditions and the same procedure as Example 2, thereby obtaining each epitaxial silicon wafer. Each of the 50 epitaxial silicon wafers was determined as Comparative Example 2.

<Comparative Test and Evaluation>

Warpage of each of the 50 epitaxial silicon wafers according to Example 2 and the 50 epitaxial silicon wafers according to Comparative Example 2 was measured by the flatness-measuring instrument manufactured by ADE Corporation, and FIGS. 11(b) and 12(b) show their distributions. The warpage distribution in each of FIGS. 11(b) and 12(b) shows a warpage distribution represented by so-called warp values, and this warp value is a value represented as a difference between a maximum displacement and a minimum displacement from a three-point reference surface or a best-fit reference surface of a backside surface of the wafer that is not adsorbed and fixed to a central surface in a wafer thickness direction.

Here, the warpage distribution in each of FIGS. 11(a) and 12(a) is represented in the form of bow values so that a height level of irregularities can be recognized and the warpage distribution in each of FIGS. 11(b) and 12(b) is represented in the form of warp values because the warp value in which the warpage distribution of the entire wafer is reflected is generally used as a specification of the wafer warpage.

As apparent from the result depicted in FIGS. 11(b) and 12(b), the warpage of each epitaxial silicon wafer 21 according to Example 2 represented by a so-called warp value is concentrated on 13 μm, and its average value is 13.0 μm. However, the warpage of each epitaxial silicon wafer according to Comparative Example 2 represented by a so-called warp value is concentrated on 23 μm that is a larger value than that in Example 2, and its average value is 23.0 μm. That is, it can be understood that the warpage of the epitaxial silicon wafer 21 according to Example 2 is 10 μm reduced as compared with the epitaxial silicon wafer according to Comparative Example 2. It can be considered that this reduction occurs because the bowl-shaped warpage concave at the central part that is formed to the epitaxial growth silicon wafer 12 according to Example 2 cancels out warpage that is produced when the epitaxial silicon wafer 21 is obtained, and the effect of the present invention was confirmed.

What is claimed is:

1. A method for manufacturing a silicon wafer, comprising:
   providing a thin discoid silicon wafer having a substantially uniform thickness;
   subjecting a first main surface of the thin discoid silicon wafer to at least one of grinding and polishing to give the first main surface a convex configuration such that a thickness of the thin discoid silicon wafer increases from a wafer outer periphery toward a wafer center; and
   subjecting a second main surface of the thin discoid silicon wafer to at least one of grinding and polishing to shape the thin discoid silicon wafer to have a substantially uniform thickness throughout the thin discoid silicon wafer and give the second main surface thereof a bowl-shaped warpage with a concavity in a central part of the second main surface.

2. A method for manufacturing a silicon wafer, comprising:
   holding one main surface of a disk-shaped thin discoid silicon wafer against a support;
   subjecting the other main surface of the thin discoid silicon wafer to at least one of grinding and polishing to give the other main surface a convex configuration such that a thickness of the thin discoid silicon wafer increases from a wafer outer periphery toward a wafer center;
   freeing the one main surface of the thin discoid silicon wafer from the support and holding the other main surface thereof against the support such that the thin discoid silicon wafer elastically deforms to make the one main surface generally convex with a peak at the center of the one main surface;
   subjecting the one main surface of the thin discoid silicon wafer to at least one of grinding and polishing to flatten the one main surface; and
   freeing the other main surface of the thin discoid silicon wafer from the support, resulting in that the thin discoid silicon wafer elastically deforms back to have a bowl-shaped warpage in the one main surface with a concavity in a central part of the one main surface.

3. The method for manufacturing a silicon wafer according to claim 1, further comprising:
   presenting the thin discoid silicon wafer being generally concave in the one main surface and substantially uniform in thickness throughout the wafer as a support substrate;
   layering an active layer substrate wafer on the one main surface of the support substrate wafer with an oxide film interposed therebetween to bond both the wafers; and
   reducing a thickness of the active layer substrate wafer to form an active layer on the one main surface of the support substrate wafer.

4. The method for manufacturing a silicon wafer according to claim 2, further comprising:
   presenting the thin discoid silicon wafer being concave in the one main surface as a support substrate;
   layering an active layer substrate wafer on the one main surface of the support substrate wafer with an oxide film interposed therebetween to bond both the wafers; and
   reducing a thickness of the active layer substrate wafer to form an active layer on the one main surface of the support substrate wafer.

5. The method for manufacturing a silicon wafer according to claim 1, further comprising forming an epitaxial layer on the one main surface of the thin discoid silicon wafer.

6. The method for manufacturing a silicon wafer according to claim 2, further comprising forming an epitaxial layer on the one main surface of the thin discoid silicon wafer.

* * * * *